United States Patent
Ushiyama et al.

(10) Patent No.: US 8,952,409 B2
(45) Date of Patent: Feb. 10, 2015

(54) LIGHT EMITTING DEVICE INCLUDING A FLUORESCENT MATERIAL LAYER

(71) Applicant: Kabushiki Kaisha Toshiba, Minato-ku, Tokyo (JP)

(72) Inventors: Naoya Ushiyama, Fukuoka-ken (JP); Gen Watari, Fukuoka-ken (JP); Masanobu Ando, Fukuoka-ken (JP); Tetsuro Komatsu, Fukuoka-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/778,903

(22) Filed: Feb. 27, 2013

(65) Prior Publication Data

US 2014/0070248 A1    Mar. 13, 2014

(30) Foreign Application Priority Data

Sep. 7, 2012 (JP) .................................. 2012-197921

(51) Int. Cl.
| | |
|---|---|
| *H01L 33/00* | (2010.01) |
| *H01L 33/50* | (2010.01) |
| *H01L 33/54* | (2010.01) |
| *H01L 33/48* | (2010.01) |

(52) U.S. Cl.
CPC .............. *H01L 33/50* (2013.01); *H01L 33/504* (2013.01); *H01L 33/54* (2013.01); *H01L 33/486* (2013.01); *H01L 33/505* (2013.01)
USPC ................................ 257/98; 257/99; 257/100

(58) Field of Classification Search
USPC ............................................ 257/98, 99, 100
See application file for complete search history.

(56) References Cited

U.S. PATENT DOCUMENTS

| | | | |
|---|---|---|---|
| 2008/0185610 A1 | 8/2008 | Kushimatsu et al. | |
| 2010/0052504 A1* | 3/2010 | Sato et al. ..................... | 313/483 |
| 2010/0140640 A1 | 6/2010 | Shimokawa et al. | |
| 2010/0148198 A1* | 6/2010 | Sugizaki et al. ................ | 257/98 |
| 2010/0258830 A1* | 10/2010 | Ide et al. ......................... | 257/98 |
| 2011/0149600 A1 | 6/2011 | Jang | |
| 2011/0297985 A1 | 12/2011 | Naka | |
| 2011/0297987 A1 | 12/2011 | Koizumi et al. | |
| 2012/0217528 A1 | 8/2012 | Furukawa | |
| 2012/0235169 A1* | 9/2012 | Seko et al. ...................... | 257/88 |
| 2013/0193464 A1* | 8/2013 | Bae et al. ......................... | 257/94 |
| 2013/0193839 A1* | 8/2013 | Kobayashi .................... | 313/502 |

FOREIGN PATENT DOCUMENTS

| | | |
|---|---|---|
| JP | 2002-033520 A | 1/2002 |
| JP | 2004-103266 A | 4/2004 |

(Continued)

*Primary Examiner* — Bilkis Jahan
(74) *Attorney, Agent, or Firm* — Posz Law Group, PLC

(57) ABSTRACT

According to one embodiment, a semiconductor light-emitting device includes a semiconductor light-emitting layer, a pair of electrodes, a fluorescent material layer and a chromaticity adjusting layer. The semiconductor light-emitting layer emits first light. The pair of electrodes is connected to the semiconductor light-emitting layer. The fluorescent material layer covers at least a center portion of the semiconductor light-emitting layer, and contains a fluorescent material to absorb the first light and radiate second light. The chromaticity adjusting layer covers at least a peripheral portion of the semiconductor light-emitting layer, is exposed to outside, and contains a fluorescent material with a concentration lower than a concentration of the fluorescent material in the fluorescent material layer.

4 Claims, 18 Drawing Sheets

(56) References Cited

FOREIGN PATENT DOCUMENTS

| JP | 2008-192769 A | 8/2008 |
|---|---|---|
| JP | 2009-193994 A | 8/2009 |
| JP | 2010-55876 A | 3/2010 |
| JP | 2011-129916 A | 6/2011 |
| JP | 2011-138831 A | 7/2011 |
| JP | 2011-146646 A | 7/2011 |
| JP | 2011-258657 A | 12/2011 |
| JP | 2011-258658 A | 12/2011 |
| JP | 2011-258675 A | 12/2011 |
| JP | 2012-28501 A | 2/2012 |

* cited by examiner

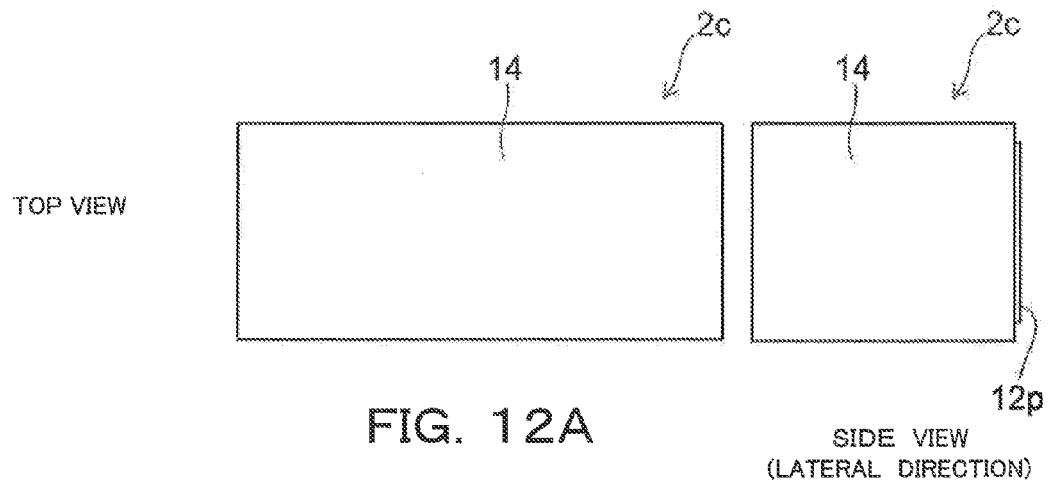
FIG. 12A
FIG. 12D
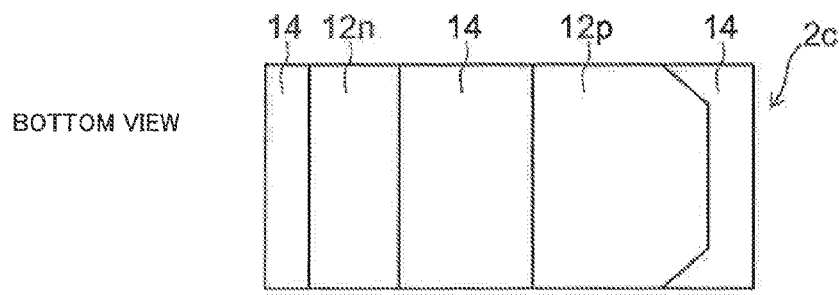
FIG. 12B
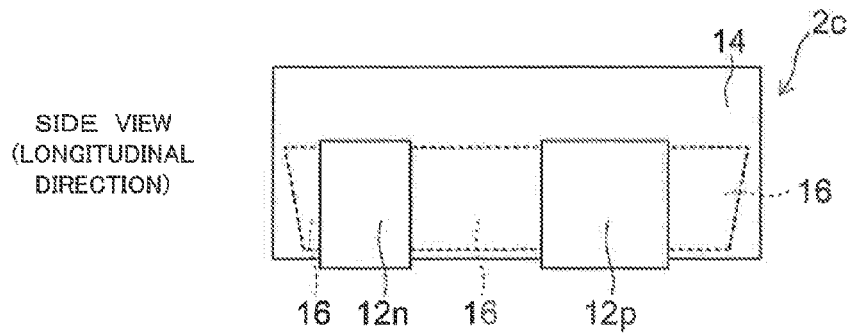
FIG. 12C

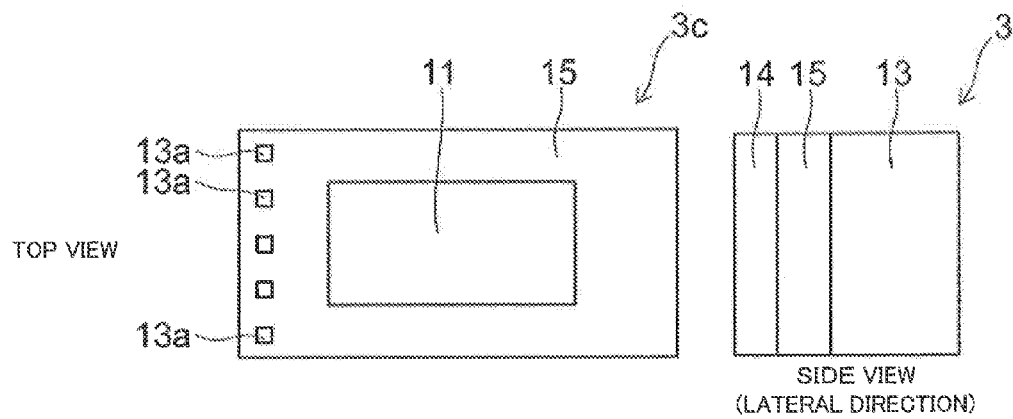
FIG. 16A
FIG. 16D
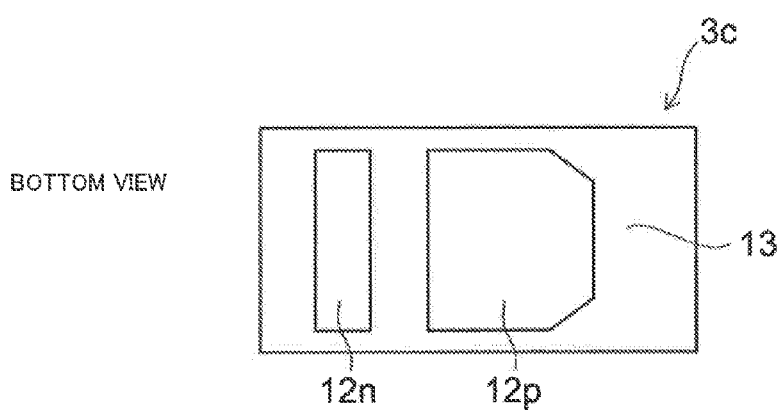
FIG. 16B
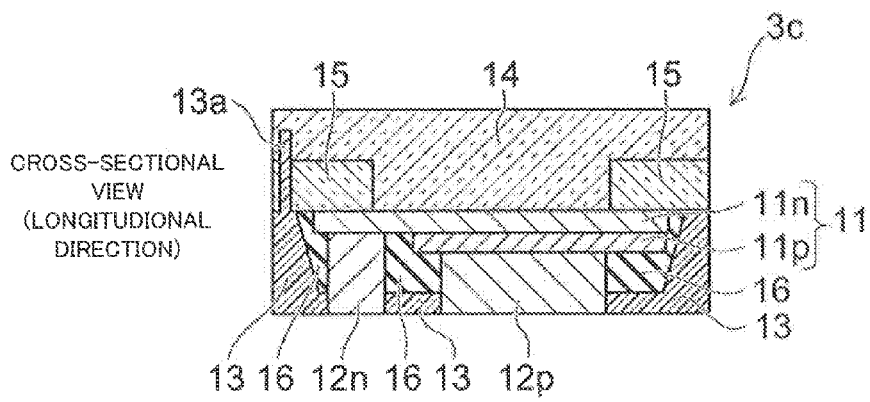
FIG. 16C

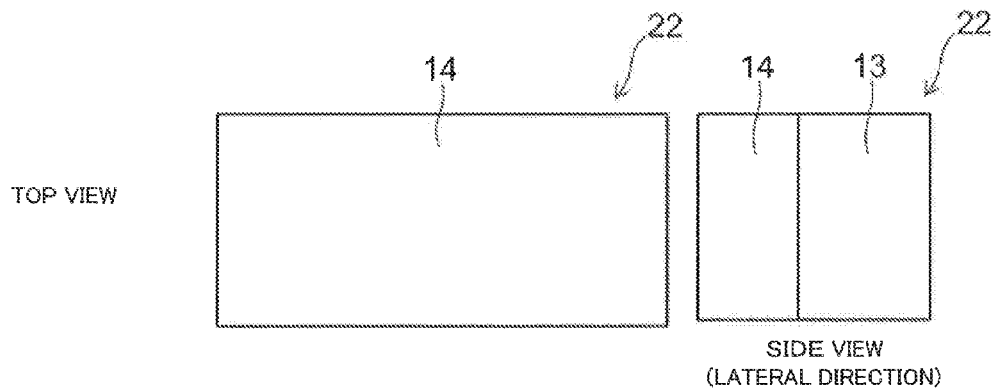
TOP VIEW
FIG. 18A
SIDE VIEW (LATERAL DIRECTION)
FIG. 18D
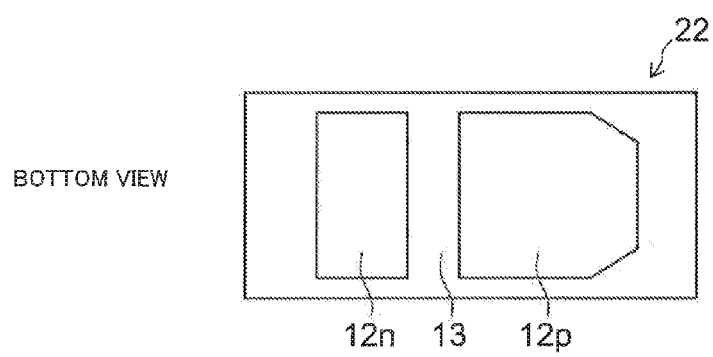
BOTTOM VIEW
FIG. 18B
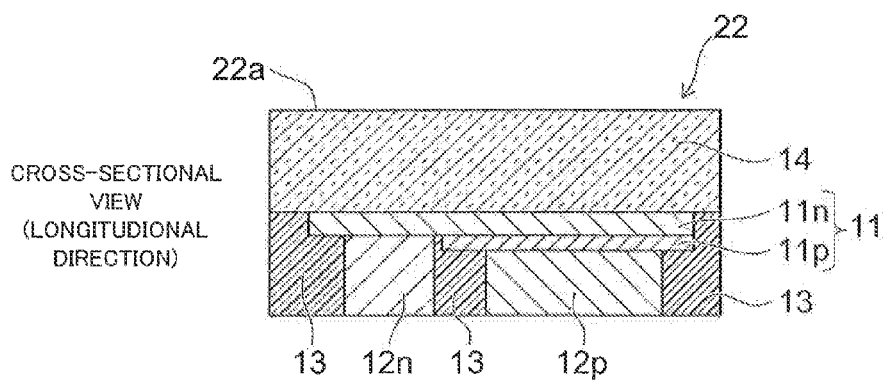
CROSS-SECTIONAL VIEW (LONGITUDIONAL DIRECTION)
FIG. 18C

LIGHT EMITTING DEVICE INCLUDING A FLUORESCENT MATERIAL LAYER

CROSS REFERENCE TO RELATED APPLICATION

This application is based upon and claims the benefit of priority from the prior Japanese Patent Application No. 2012-197921, filed on Sep. 7, the entire contents of which are incorporated herein by reference.

FIELD

Embodiments described herein generally relates to a semiconductor light-emitting device and a semiconductor light-emitting module.

BACKGROUND

Many of semiconductor light-emitting devices which emit white light are provided with a nitride semiconductor light-emitting layer to emit blue light, and a fluorescent material layer containing a fluorescent material to absorb the blue light and radiate yellow light (or green light, or red light). However, since an intensity distribution property of the blue light emitted from the nitride semiconductor light-emitting layer and an intensity distribution property of the yellow light (or the green light, or the red light) radiated from the fluorescent material layer differ from one another, a ratio of the intensity of the blue light to the intensity of the yellow light differs depending on a direction from which the semiconductor light-emitting device is viewed. As a result, there is a problem that a difference in chromaticity (color breakup) depending on the direction is generated.

BRIEF DESCRIPTION OF THE DRAWINGS

FIGS. 12A to 12D are diagrams exemplifying a semiconductor light-emitting device of a third modification according to the second embodiment;

FIGS. 16A to 16D are diagrams exemplifying a semiconductor light-emitting device of a third modification according to the third embodiment;

FIGS. 18A to 18D are diagrams exemplifying a semiconductor light-emitting device of the light-emitting module according to the fourth embodiment.

DETAILED DESCRIPTION

Figure 1A:
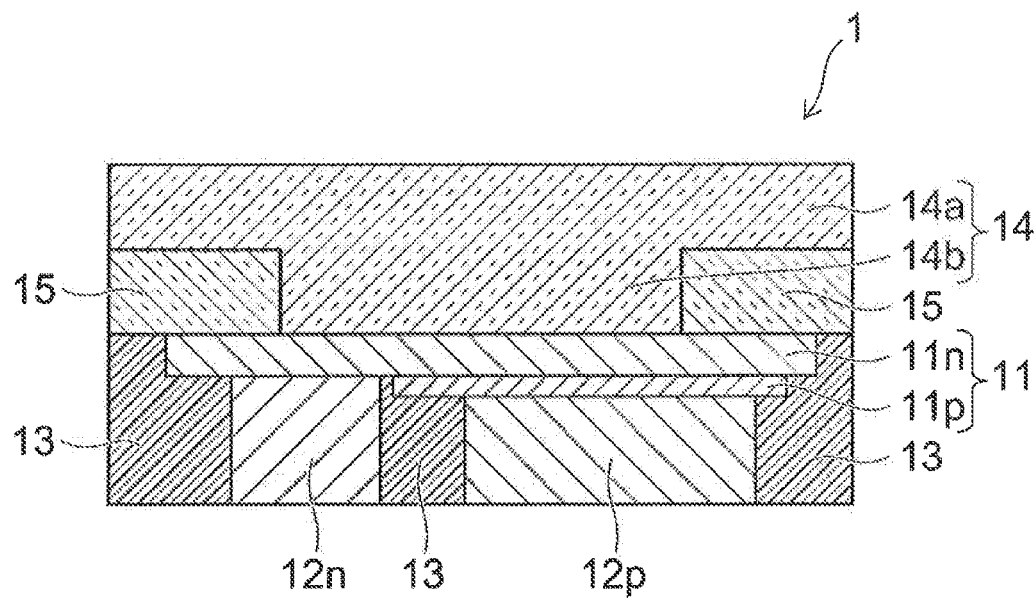
FIGS. 1A and 1B are diagrams illustrating a semiconductor light-emitting device according to a first embodiment.

According to one embodiment, a semiconductor light-emitting device includes a semiconductor light-emitting layer, a pair of electrodes, a fluorescent material layer and a chromaticity adjusting layer. The semiconductor light-emitting layer emits first light. The pair of electrodes is connected to the semiconductor light-emitting layer. The fluorescent material layer covers at least a center portion of the semiconductor light-emitting layer, and contains a fluorescent material to absorb the first light and radiate second light. The chromaticity adjusting layer covers at least a peripheral portion of the semiconductor light-emitting layer, is exposed to outside, and contains a fluorescent material with a concentration lower than a concentration of the fluorescent material in the fluorescent material layer.

According to another embodiment, a semiconductor light-emitting module includes a mount board and a plurality of semiconductor light-emitting devices. The mount board has a flat first region and a flat second region on a top surface. The second region is sloped to the first region. The plurality of semiconductor light-emitting devices is mounted on the first region and the second region of the mount board. Each semiconductor light-emitting device includes a semiconductor light-emitting layer, a pair of electrodes, and a fluorescent material layer. The semiconductor light-emitting layer emits first light. The pair of electrodes is connected to the semiconductor light-emitting layer. The fluorescent material layer is disposed above the semiconductor light-emitting layer, and contains a fluorescent material to absorb the first light and radiate second, light.

An embodiment will be described with reference to drawings. In the drawing, the same reference numerals denote the same or similar portions.

Figure 1B:
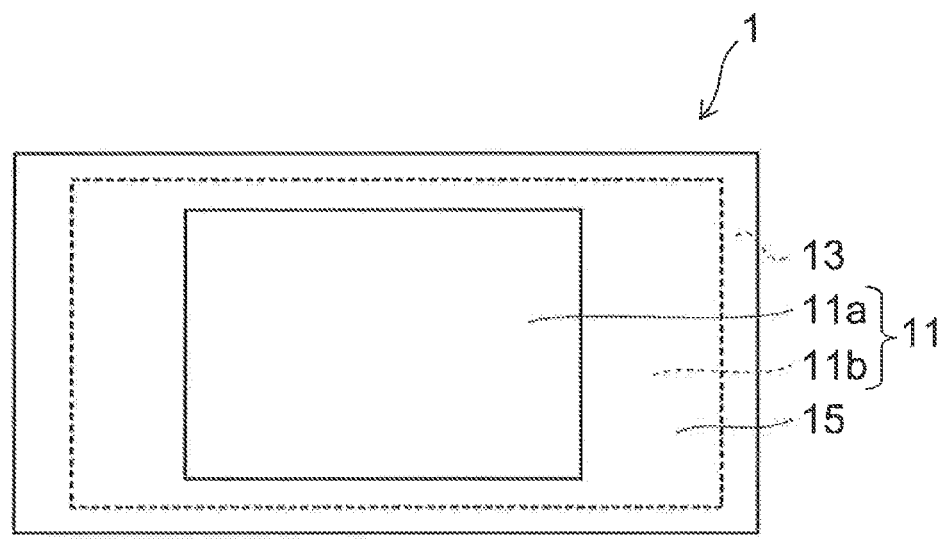

Firstly, a first embodiment will be described. FIG. 1A is a cross sectional view exemplifying a semiconductor light-emitting device in accordance with the first embodiment, and FIG. 1B is a top view of the semiconductor light-emitting device. In addition, in FIG. 1B, a fluorescent material layer is omitted for the sake of easier view of the diagram.

As illustrated in FIGS. 1A and 11B, a semiconductor light-emitting device 1 of the first embodiment includes a semiconductor light-emitting layer 11. The semiconductor light-emitting layer 1 is formed of a nitride semiconductor containing Gallium Nitride (GaN), for example, and has an n-type layer 11n laminated on a p-type layer 11p. As seen from below, an area of the p-type layer 11p is smaller than an area of the n-type layer 11n, and so a portion of a bottom surface of the n-type layer 11n is not covered by the p-type layer 11p. The semiconductor light-emitting layer 11 emits blue light, for example.

A p-side electrode 12p and an n-side electrode 12n are disposed below the semiconductor light-emitting layer 11. A top surface of the p-side electrode 12p is connected to a bottom surface of the p-type layer 11p of the semiconductor light-emitting layer 11. A top surface of the n-side electrode 12n is connected to a region in the bottom surface of the n-type layer 11n of the semiconductor light-emitting layer 11 that is not covered by the p-type layer 11p.

A reinforcement resin layer 1.3 made of black resin for example is provided side and below the semiconductor light-emitting layer 11. The reinforcement resin layer 13 covers a side surface and the bottom surface of the semiconductor light-emitting layer 11 as well as side surfaces of the p-side electrode 12p and the n-side electrode 12n. An outer shape of the reinforcement resin layer 13 is a rectangular parallelepiped shape. A top surface of the semiconductor light-emitting layer 11 is exposed at a top surface of the reinforcement resin layer 13. Bottom surfaces of the p-side electrode 12p and the n-side electrode 12n are exposed at a bottom surface of the reinforcement resin layer 13.

A fluorescent material layer 14 is provided above the semiconductor light-emitting layer 11. Fluorescent material (not shown) is dispersed in transparent resin in the fluorescent material layer 14. In addition, the "transparent resin" includes semitransparent resin in addition to transparent resin. The fluorescent material absorbs the blue light emitted from the semiconductor light-emitting layer 11 and radiates yellow light.

A shape of the fluorescent material layer 14 is formed by integrally coupling a flat plate-shaped top portion 14a configuring an uppermost layer in the entire semiconductor light-emitting device 1 and a bottom portion 14b provided in a directly below region at a center portion of the top portion 14a. The bottom portion 14b of the fluorescent material layer 14 directly abuts a center portion 111a of the semiconductor light-emitting layer 11 or abuts via a thin protective layer (not shown), and covers the center portion 11a.

Further, a chromaticity adjusting layer 15 is provided in the semiconductor light-emitting device 1. A shape of the chromaticity adjusting layer 15 is a frame shape, for example, and is provided between a peripheral portion 11b of the semiconductor light-emitting layer 11 as well as a portion of the reinforcement resin layer 13 disposed beside the semiconductor light-emitting layer 11 and the top portion 14a of the fluorescent material layer 14. Accordingly, the chromaticity adjusting layer 15 covers the peripheral portion 11b of the semiconductor light-emitting layer 11.

The chromaticity adjusting layer 15 is formed of transparent resin, for example, silicone resin. The chromaticity adjusting layer 15 either does not contain fluorescent material or contains the fluorescent material at a lower concentration than a concentration of the fluorescent material in the fluorescent material layer 14.

In the specification, such a case will collectively be referred to as "the concentration of the fluorescent material in the chromaticity adjusting layer 15 being lower than the concentration of the fluorescent material in the fluorescent material layer 14". That is to say, a concentration that is lower than the concentration of the fluorescent material in the fluorescent material layer 14 includes a case where the concentration is zero. In addition, the "concentration of the fluorescent material" refers to a total mass of the fluorescent material contained in the transparent resin per unit volume.

An outer shape of the semiconductor light-emitting device 1 is a rectangular parallelepiped shape, for example. A longitudinal direction of the semiconductor light-emitting device 1 is an aligning direction of the p-side electrode 12p and the n-side electrode 12n. An outer surface of the semiconductor light-emitting device 1 is configured by the reinforcement resin layer 13, the fluorescent material layer 14, the chromaticity adjusting layer 15, the p-side electrode 12p, and the n-side electrode 12n.

More specifically, a bottom surface of the reinforcement resin layer 13, the bottom surface of the p-side electrode 12p, and the bottom surface of the n-side electrode 12n are exposed at a bottom surface of the semiconductor light-emitting device 1. In the following order from a lower side, a side surface of the reinforcement resin layer 13, a side surface of the chromaticity adjusting layer 15, and a side surface of the fluorescent material layer 14 are exposed at a side surface of the semiconductor light-emitting device 1. A top surface of the fluorescent material layer 14 is exposed at a top surface of the semiconductor light-emitting device 1.

Next, workings and effects of the first embodiment will be described. The semiconductor light-emitting device 1 is mounted on a mount board by joining the bottom surfaces of the p-side electrode 12p and the n-side electrode 12n to electrodes of the mount board (not shown) via solder humps (not shown).

Then, power is supplied to the semiconductor light-emitting layer 11 by applying a voltage between the p-side electrode 12p and the n-side electrode 12n via the electrodes of the mount board. Accordingly, the semiconductor light-emitting layer 11 thereby emits the blue light.

A portion of the blue light emitted from the semiconductor light-emitting layer 11 is absorbed by the fluorescent material layer 14 or the fluorescent materials contained in the fluorescent material layer 14 and the chromaticity adjusting layer 15. The fluorescent materials that have absorbed the blue light radiate yellow light.

Accordingly, the light emitted from the semiconductor light-emitting device 1 is light that the blue light not absorbed by the fluorescent materials after emitted from the semiconductor light-emitting layer 11 and the yellow light radiated from the fluorescent materials are mixed.

Figure 2A:
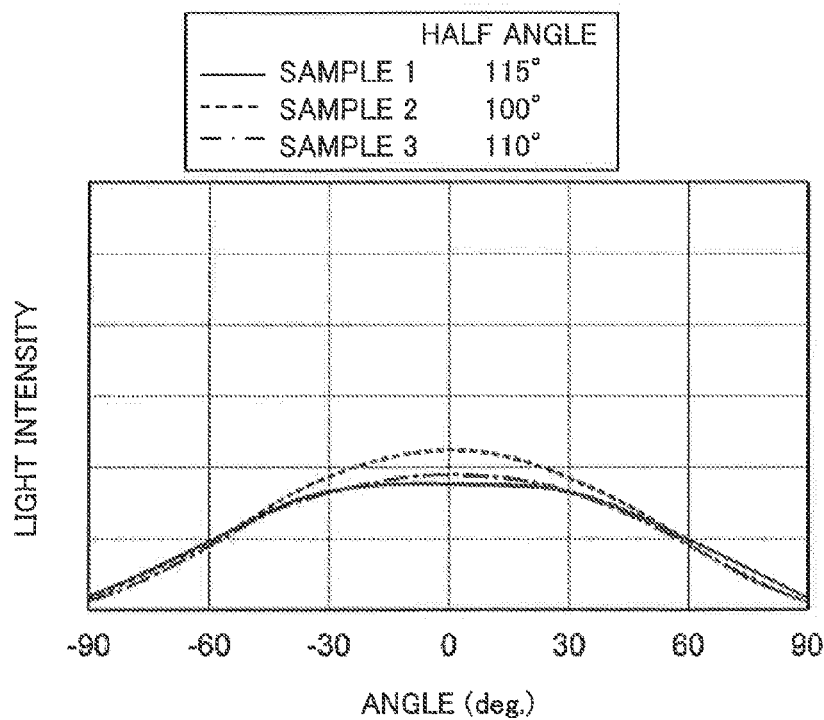
FIGS. 2A and 2B are graphs exemplifying light intensity distribution properties of the semiconductor light-emitting device by using an angle as a horizontal axis and light intensity as a vertical axis.
Figure 2B:
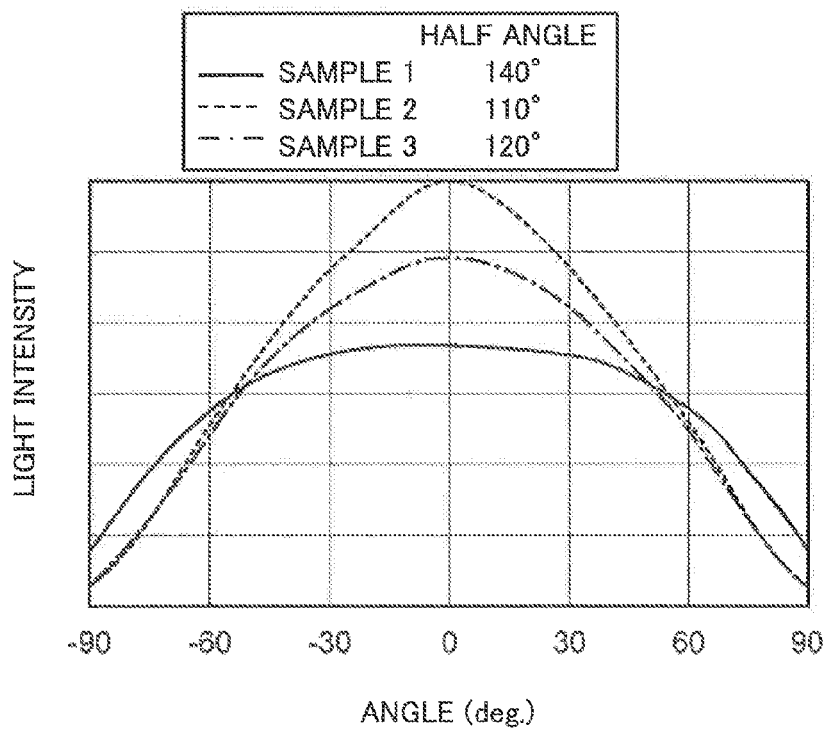

FIGS. 2A and 2B are graphs exemplifying light intensity distribution properties of the semiconductor light-emitting device. A horizontal axis is an angle, and a vertical axis is light intensity. FIG. 2A illustrates the blue light, and FIG. 2B illustrates the yellow light.

In addition, FIGS. 2A and 2B indicate the light intensity distribution properties in a case where the chromaticity adjusting layer 15 is not provided. Further, FIGS. 2A and 2B illustrate measurement results of three samples.

The angle illustrated by the horizontal axis of FIGS. 2A and 2B sets a vertically upward direction (vertex direction) to be at 0°, and a horizontal direction is set with +900 and −90°. Further, a "half angle" illustrated in FIGS. 2A and 2B expresses a breadth of an angle range by which light intensity becomes half or more of a maximum value. The larger the half-angle is, the broader the light intensity distribution properties are.

As illustrated in FIGS. 2A and 2B, the blue light and the yellow light both take maximum values in a direction of 0°, that is, in the vertically upward direction, and the values decrease as the angle becomes larger. However, since the half angle of the yellow light is larger than the half angle of the blue light, the intensity distribution property of the yellow light is broad compared to the intensity distribution property of the blue light.

When the chromaticity adjusting layer 15 is not provided, the light emitted from the semiconductor light-emitting device 1 to a periphery of the vertically upward direction (low angle region) relatively has a higher ratio of the blue light, whereas the light emitted from the semiconductor light-emitting device 1 to a periphery of the horizontal direction (high angle region) relatively has a higher ratio of the yellow light.

When amounts of the fluorescent materials are adjusted so that the light emitted in the vertically upward direction becomes white, the color of the light emitted in the periphery of the horizontal direction becomes a color that is closer to yellow than white. Accordingly, a difference in chromaticity depending on the direction, that is, a color breakup is generated.

Thus, in the first embodiment, the chromaticity adjusting layer 15 is provided so as to cover the peripheral portion 11b of the semiconductor light-emitting layer 11. The light emitted in the periphery of the horizontal direction from the semiconductor light-emitting layer 11 permeates through the chromaticity adjusting layer 15, and is emitted from the semiconductor light-emitting device 1.

Since the concentration of the fluorescent material in the chromaticity adjusting layer 15 is lower than the concentration of the fluorescent material in the fluorescent material layer 14, a rate of the light emitted in the periphery of the horizontal direction being absorbed by the fluorescent material is low, and a blue component is prominent. The chromaticity of the light emitted in the periphery of the horizontal direction is corrected, and can approximate the chromaticity of the light emitted in the vertically upward direction. As a result, the color breakup can be suppressed.

The chromaticity adjusting layer 15 can prevent the fluorescent materials from excessively absorbing the light emitted in the periphery of the horizontal direction from the semiconductor light-emitting layer 11. Extraction efficiency of light can be improved.

Further, in the first embodiment, since the chromaticity adjusting layer 15 is exposed at the side surface of the semiconductor light-emitting device 1, a portion of the light that had entered the chromaticity adjusting layer 15 does not re-enter the fluorescent material layer 14, and is emitted from the side surface of the semiconductor light-emitting device 1. The effect of suppressing the color breakup can further be enhanced, and the extraction efficiency of light can further be improved.

Yet further, in the first embodiment, a refractive index of the transparent resin forming the chromaticity adjusting layer 15 is higher than a refractive index of the transparent resin forming the fluorescent material layer 14. Due to this, when the light progresses from the chromaticity adjusting layer 15 toward the fluorescent material layer 14, a total reflection of the light is more likely to be achieved at an interface of the chromaticity adjusting layer 15 and the fluorescent material layer 14. As a result, the light that had entered the chromaticity adjusting layer 15 becomes more unlikely to re-enter the fluorescent material layer 14, whereby the color breakup can more effectively be suppressed, and the extraction efficiency of light can yet be further improved.

The effect of suppressing the color breakup and the effect of improving the extraction efficiency of light as aforementioned are more prominent with lower concentration of the fluorescent material in the chromaticity adjusting layer 15, and becomes maximum in a case of no fluorescent material content. On the other hand, by causing the chromaticity adjusting layer 15 to contain the fluorescent material at a lower concentration, a fine adjustment of the chromaticity of the light emitted in the periphery of the horizontal direction from the semiconductor light-emitting device 1 can be conducted.

Figure 3:
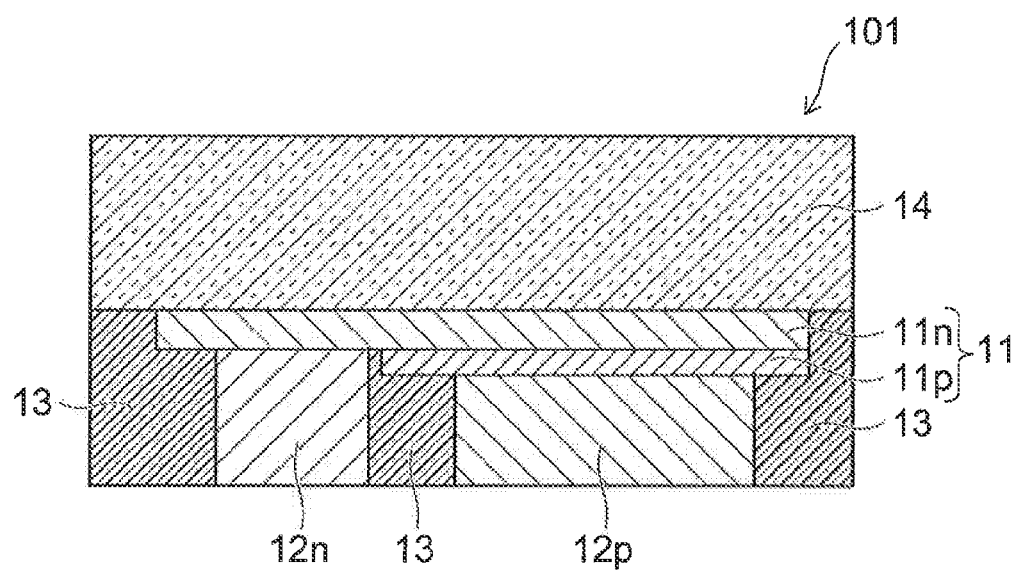
FIG. 3 is a cross sectional view exemplifying a semiconductor light-emitting device of a comparative example according to the first embodiment.

Next, a comparative example will be described. FIG. 3 is a cross sectional view illustrating a semiconductor light-emitting device of the comparative example.

As illustrated in FIG. 3, in a semiconductor light-emitting device 101 of the comparative example, a chromaticity adjusting layer 15 (see FIG. 1A) is not provided. Therefore, a color breakup caused by a difference in intensity distribution properties of blue light and yellow light exemplified in FIGS. 2A and 2B is generated. Further, light emitted in a periphery of a horizontal direction from a semiconductor light-emitting layer 11 is excessively absorbed by a fluorescent material in a fluorescent material layer 14, so extracting efficiency of light is low.

Figure 4:
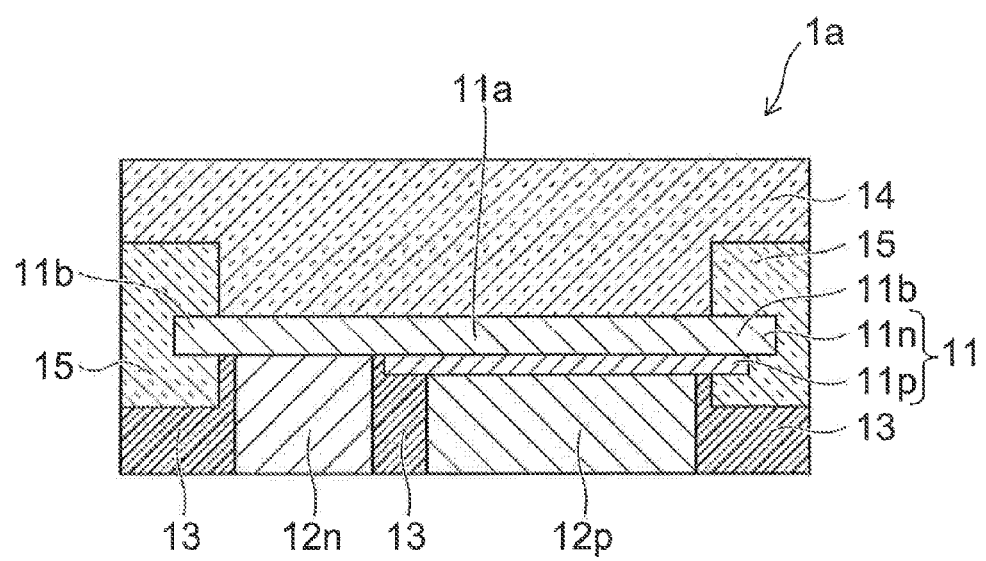
FIG. 4 is a cross sectional view exemplifying a semiconductor light-emitting device of a first modification according to the first embodiment.

Next, a first modification of the first embodiment will be described. FIG. 4 is a cross sectional view exemplifying a semiconductor light-emitting device of the first modification.

As illustrated in FIG. 4, in a semiconductor light-emitting device 1a of the first modification, a chromaticity adjusting layer 15 is further disposed in a region immediately below a peripheral portion 11b of a semiconductor light-emitting layer 11, and further covers a bottom surface of a peripheral portion 11b. The chromaticity adjusting layer 15 covers the peripheral portion lib of the semiconductor light-emitting layer 11 from three directions.

Therefore, a ratio of blue light in the light emitted in the periphery of the horizontal direction can further be increased. Further, as for light emitted obliquely downward from the peripheral portion 111b of the semiconductor light-emitting layer 11 also, since the light can be extracted to outside of a semiconductor light-emitting device 1 via the chromaticity adjusting layer 15, extraction efficiency of light can yet be further improved.

Configurations, workings and effects of the first modification other than the above are similar to those of the above described first embodiment.

Figure 5:
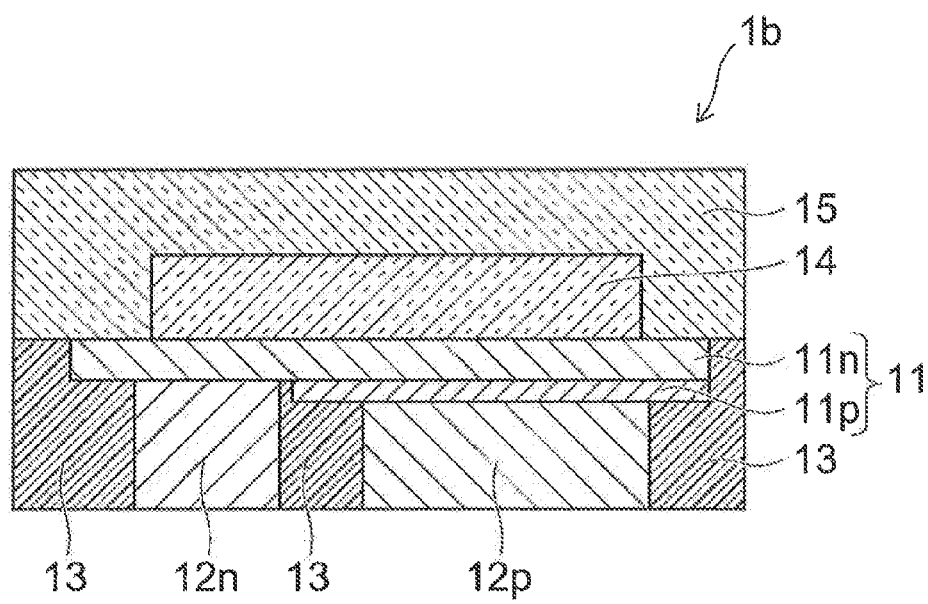
FIG. 5 is a cross sectional view exemplifying a semiconductor light-emitting device of a second modification of the first embodiment.

Next, a second modification of the first embodiment will be described. FIG. 5 is a cross sectional view exemplifying a semiconductor light-emitting device of the second modification.

As illustrated in FIG. 5, in a semiconductor light-emitting device 1b of the second modification, a fluorescent material layer 14 is provided only at a position corresponding to the bottom portion 14b of the fluorescent material layer 14 in the semiconductor light-emitting device 1 in the above described first embodiment (see FIG. 1A). A chromaticity adjusting layer 15 is provided at a position corresponding to the top portion 14a. That is, the chromaticity adjusting layer 15 covers entireties of a top surface and a side surface of the fluorescent material layer 14. The fluorescent material layer 14 is not exposed from an outer surface of the semiconductor light-emitting device 1b, and the chromaticity adjusting layer 15 configures top portions of a top surface and a side surface of a semiconductor light-emitting device 1. Further, in the second modification, since a volume of the fluorescent material layer 14 is small compared to the above described first embodiment, a concentration of a fluorescent material in the fluorescent material layer 14 is made higher correspondingly.

In accordance with the second modification also, effects similar to those in the aforementioned first embodiment can be achieved. Configurations as well as workings and effects of the second modification other than the above are similar to those of the above described first embodiment.

Figure 6:
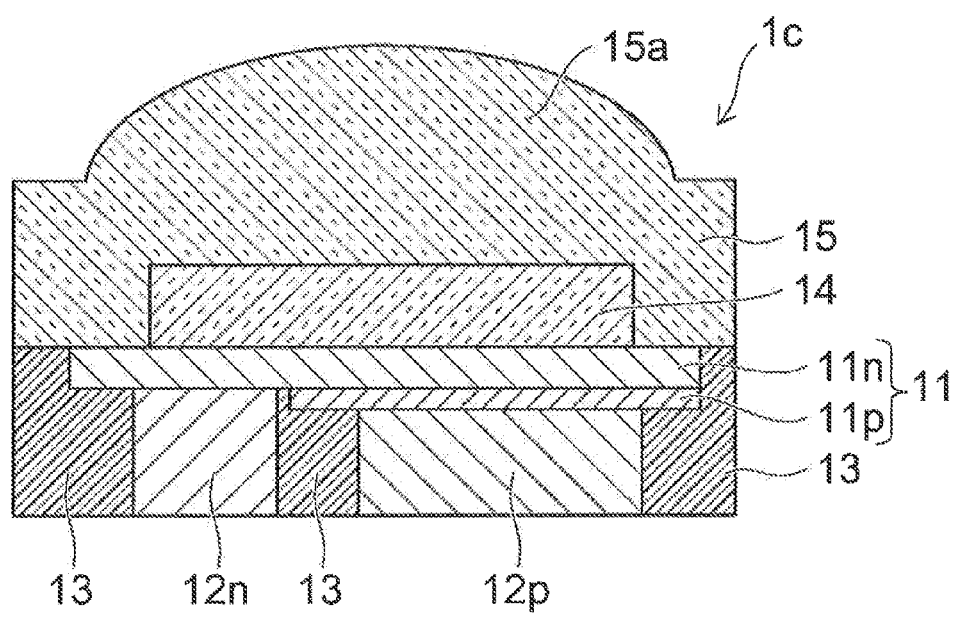
FIG. 6 is a cross sectional view exemplifying a semiconductor light-emitting device of a third modification according to the first embodiment.

Next, a third modification of the first embodiment will be described. FIG. 6 is a cross sectional view exemplifying a semiconductor light-emitting device of the third modification.

As illustrated in FIG. 6, compared to the semiconductor light-emitting device 1b in the above described second modification (see FIG. 5), a semiconductor light-emitting device 1c of the third modification differs in that a convex lens portion 15a is formed on a top surface of a chromaticity adjusting layer 15.

In accordance with the third modification, a portion of the light emitted from the semiconductor light-emitting layer 11 can be collected by the convex lens portion 15a formed at the top surface of the chromaticity adjusting layer 15. Therefore, extraction efficiency of light can be enhanced.

Configurations as well as workings and effects of the third modification other than the above are similar to those of the above described second embodiment.

Figure 7:
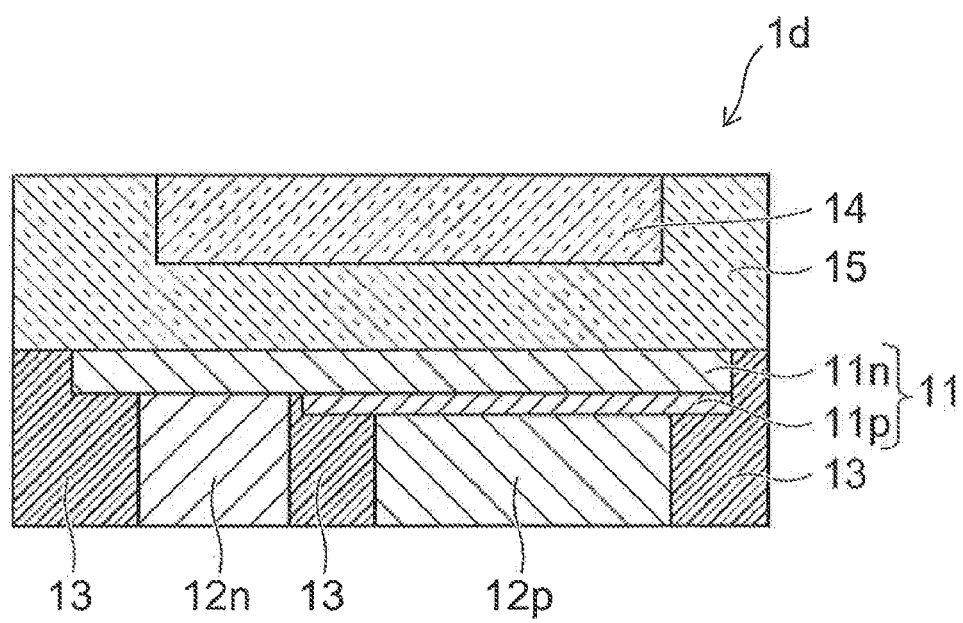
FIG. 7 is a cross sectional view exemplifying a semiconductor light-emitting device of a fourth modification according to the first embodiment.

Next, a fourth modification of the first embodiment will be described. FIG. 7 is a cross sectional view exemplifying a semiconductor light-emitting device of the fourth modification.

As illustrated in FIG. 7, compared to the semiconductor light-emitting device 1b of the above described second modification (see FIG. 5), a semiconductor light-emitting device 1d of the fourth modification differs in that a positional relationship of a fluorescent material layer 14 and a chromaticity adjusting layer 15 is inverted in an up and down direction. That is, the fluorescent material layer 14 is disposed above a semiconductor light-emitting layer 11 with a space in between, and is exposed at a center portion of a top surface of a semiconductor light-emitting device 1. Further, the chromaticity adjusting layer 15 covers an entire side surface and an entire bottom surface of the fluorescent material layer 14.

In accordance with the fourth modification, by causing the fluorescent material layer 14 to expose at the top surface of the semiconductor light-emitting device 1d, and increasing a concentration of fluorescent material in the fluorescent material layer 14, adhesiveness of the top surface of the semiconductor light-emitting device 1d can be reduced, and a handling property of the semiconductor light-emitting device 1d can be improved.

Configurations as well as workings and effects of the fourth modification other than the above are similar to those of the above described second embodiment.

Figure 8:
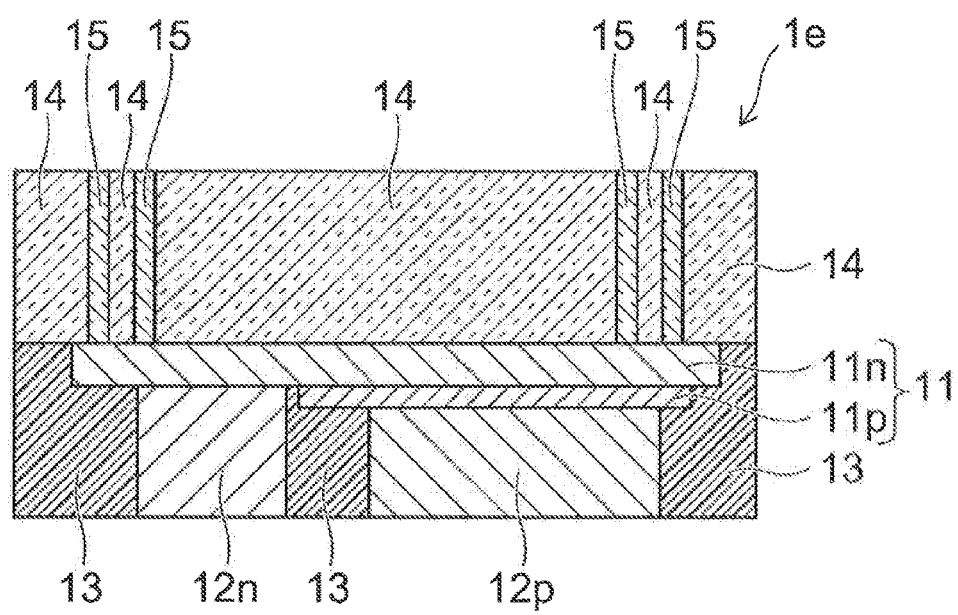
FIG. 8 is a cross sectional view exemplifying a semiconductor light-emitting device of a fifth modification according to the first embodiment.

Next, a fifth modification of the first embodiment will be described. FIG. 8 is a cross sectional view exemplifying a semiconductor light-emitting device of the fifth modification.

As illustrated in FIG. 8, compared to the semiconductor light-emitting device 1 of the above described first embodiment (see FIG. 1A), a semiconductor light-emitting device 1e of the fifth modification differs in that a chromaticity adjusting layer 15 is divided into plural pieces of columnar shape. The chromaticity adjusting layer 15 that is divided in to plural pieces of columnar shape is arranged in a doubled loop shape along a side surface of the semiconductor light-emitting device 1e. Each columnar shaped portion extends in the up and down direction, and a top surface of the columnar shaped portion is exposed at the top surface of the semiconductor light-emitting device 1e. On the other hand, the chromaticity adjusting layer 15 is not exposed at the side surface of the semiconductor light-emitting device 1e.

In the fifth modification, light emitted from a semiconductor light-emitting layer 11 toward a periphery in a horizontal direction (high angle region) is adjusted of the chromaticity in the course of passing through a fluorescent material layer 14 by passing also through the chromaticity adjusting layer 15. Further, with the chromaticity adjusting layer 15 functioning as an optical guide, the light emitted from the semiconductor light-emitting layer 11 propagates through the chromaticity adjusting layer 15, and is emitted from the top surface of the semiconductor light-emitting device 1e without being absorbed by the fluorescent materials. Due to this, light extraction efficiency can yet further be enhanced.

Configurations as well as workings and effects of the fifth modification other than the above are similar to those of the above described first embodiment.

In Addition, a shape of the chromaticity adjusting layer 15 may not be of the columnar shape, but may be of a frame shape that is disposed singly or doubly or more.

Figure 9:
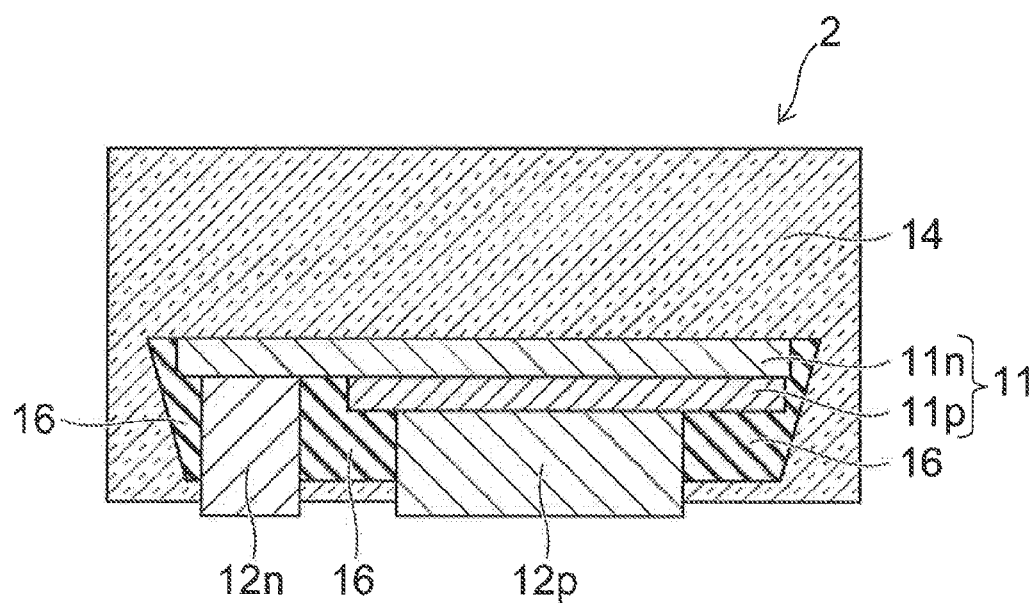
FIG. 9 is a cross sectional view exemplifying a semiconductor light-emitting device according to a second embodiment.

Next, a second embodiment will be described. FIG. 9 is a cross sectional view exemplifying a semiconductor light-emitting device of the second embodiment.

As illustrated in FIG. 9, in a semiconductor light-emitting device 2 of the second embodiment, a semiconductor light-emitting layer 11, a p-side electrode 12p, and an n-side electrode 12n are provided. Configurations and positional relationships of these members are similar to those in the above-described first embodiment (see FIGS. 1A and 1B).

In the second embodiment, an insulating layer 16 is provided so as to cover a side surface and a bottom surface of the semiconductor light-emitting layer 11, an upper side surface of the p-side electrode 12p, and an upper side surface of the n-side electrode 12n. The insulating layer 16 is formed of an insulating material, such as a nonorganic material, for example. Further, a fluorescent material layer 14 is provided so as to cover the semiconductor light-emitting layer 11, the p-side electrode 12p, the n-side electrode 12n, and the insulating layer 1.6. In the fluorescent material layer 14, a fluorescent material is dispersed in a transparent resin such as silicone resin and the like, for example. The fluorescent material absorbs blue light emitted from the semiconductor light-emitting layer 11 and radiates yellow light.

An entirety of the semiconductor light-emitting layer 11 and an entirety of the insulating layer 16 are covered with the fluorescent material layer 14. That is, the fluorescent material layer 14 is disposed above, beside, and below the semiconductor light-emitting layer 11. Portions other than each lower end portions of the p-side electrode 12p and the n-side electrode 12n are covered with the fluorescent material layer 14 directly or via the insulating layer 16. On the other hand, each lower end portions of the p-side electrode 12p and the n-side electrode 12n slightly protrudes from a bottom surface of the fluorescent material layer 14.

Accordingly, the top surface and the side surface of the semiconductor light-emitting device 2 are configured by the fluorescent material layer 14, and the bottom surface of the semiconductor light-emitting device 2 is configured by the respective lower end portions of the p-side electrode 12p and the n-side electrode 12n, and the fluorescent material layer 14. That is, an outer surface of the semiconductor light-emitting device 2 is configured by the fluorescent material layer 14, the p-side electrode 12p, and the n-side electrode 12n.

The semiconductor light-emitting device 2 of the second embodiment can be manufactured by the following method, for example. That is, the semiconductor light-emitting layer 11 is epitaxially grown on a wafer, the p-side electrode 12p and the n-side electrode 12n are formed on the semiconductor light-emitting layer 11, and these are covered with the insulating layer 16. Next, the layer formed of the transparent resin containing the fluorescent material, for example the silicone resin is deposited on the wafer so as to cover the semiconductor light-emitting layer 11, the p-side electrode 12p, the n-side electrode 12n, and the insulating layer 16. Next, the wafer is removed, and an exposed surface of the semiconductor light-emitting layer 11 is covered with the transparent resin containing the fluorescent material. Thereafter, dicing is performed. The semiconductor light-emitting device 2 is manufactured thereby.

Next, workings and effects of the second embodiment will be described.

In the semiconductor light-emitting device 2 of the second embodiment, a reinforcement resin layer formed of black resin is not provided, and the fluorescent material layer 14 is disposed below as well as side of the semiconductor light-emitting layer 11. Therefore, the blue light emitted from the fluorescent material layer 14 downward and to the side permeates the insulating layer 16 and enters the fluorescent material layer 14. A portion of the blue light that entered the fluorescent material layer 14 is absorbed by the fluorescent material, and the rest of the light permeates through the fluorescent material layer 14 as is, and is emitted from a lower portion of the semiconductor light-emitting device 2. On the other hand, the fluorescent material that absorbed the blue light radiates the yellow light. Therefore, white light in which the blue light and the yellow light are mixed is emitted also from the lower portion of the semiconductor light-emitting device 2. The light emitted as described above is reflected with a top surface of a mount board (not shown), for example, onto which the semiconductor light-emitting device 2 is mounted, and is directed upward.

In accordance with the second embodiment, not only the light emitted upward from the semiconductor light-emitting layer 11 but also the light emitted downward and to the side can be extracted as white light to outside of the semiconductor light-emitting device 2. As a result, loss in the light is reduced, and the extraction efficiency is improved. On the contrary, in a semiconductor light-emitting device 101 illustrated in FIG. 3, for example, light emitted from a semiconductor light-emitting layer 11 downward and sideways is absorbed by the reinforcement resin layer 13 formed of the black resin, and thus cannot be extracted to the outside.

Figure 10:
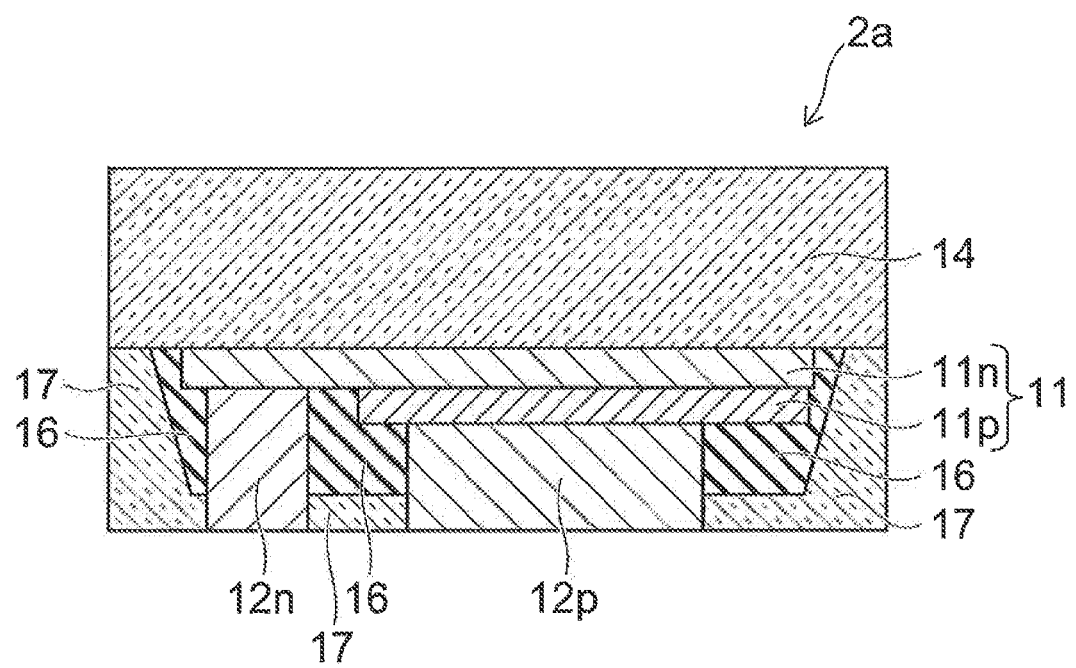
FIG. 10 is a cross sectional view exemplifying a semiconductor light-emitting device of a first modification according to the second embodiment.

Next, a first modification of the second embodiment will be described. FIG. 10 is a cross sectional view exemplifying a semiconductor light-emitting device of the first modification.

As illustrated in FIG. 10, compared to the semiconductor light-emitting device 2 of the above described second embodiment (see FIG. 6), a semiconductor light-emitting device 2a of the first modification differs in that a lower portion of a fluorescent material layer 14 is replaced by a transparent resin layer 17. That is, in the semiconductor light-emitting device 2a, the fluorescent material layer 14 is disposed only above a semiconductor light-emitting layer 11, and the transparent resin layer 1.7 is disposed beside and below the semiconductor light-emitting layer 11. The transparent resin layer 17 is formed of transparent silicon resin that does not contain a fluorescent material, for example.

Accordingly, a top surface of the semiconductor light-emitting device 2a is configured by the fluorescent material layer 14, an upper portion of a side surface of the semiconductor light-emitting device 2a is configured by the fluorescent material layer 14, a lower portion of the side surface of the semiconductor light-emitting device 2a is configured by the transparent semiconductor layer 17, and a bottom surface of the semiconductor light-emitting device 2a is configured by respective lower end portions of a p-side electrode 12p and an n-side electrode 12n and the transparent resin layer 17. That is, an outer surface of the semiconductor light-emitting device 2a is configured by the fluorescent material layer 14, the transparent resin layer 17, the p-side electrode 12p, and the n-side electrode 12n.

In the first modification, most portion of blue light emitted from the semiconductor light-emitting layer 11 sideways and downward is extracted to outside the semiconductor light-emitting device 2a without being absorbed by the fluorescent material. Therefore, compared to the above described second embodiment, although chromaticity of the light emitted from the lower portion of the semiconductor light-emitting device 2a recedes from being white, light extraction efficiency can further be improved.

Configurations as well as workings and effects of the first modification other than the above are similar to those of the above described second embodiment.

Figure 11:
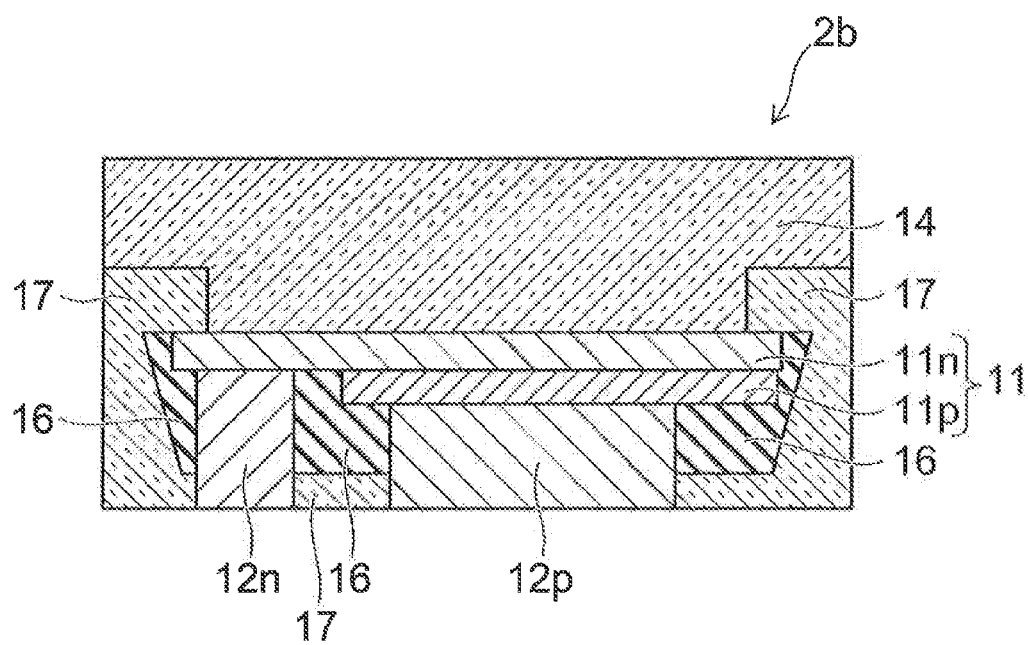
FIG. 11 is a cross sectional view exemplifying a semiconductor light-emitting device of a second modification according to the second embodiment.

Next, a second modification of the second embodiment will be described. FIG. 11 is a cross sectional view exemplifying a semiconductor light-emitting device of the second modification.

As illustrated in FIG. 11., compared to the semiconductor light-emitting device 2a of the first modification of the above described second embodiment (see FIG. 10), a semiconductor light-emitting device 2b of the second modification differs in that a peripheral portion of a transparent resin layer 17 protrudes upward than a top surface of a semiconductor light-emitting layer 11. In other words, a portion of the transparent resin layer 17 is disposed in a frame shape around the semiconductor light-emitting layer 11.

According to the second modification, a color breakup can be reduced by increasing extraction efficiency of light emitted sideways from the semiconductor light-emitting layer 11 and increasing a ratio of the blue light in the aforementioned light.

Configurations as well as workings and effects of the second modification other than the above are similar to those of the first modification of the above described second embodiment.

Next, a third modification of the second embodiment will be described. FIG. 12A is a top view exemplifying a semiconductor light-emitting device of the third modification, FIG. 12B is a bottom view of the semiconductor light-emitting device, FIG. 12C is a side view parallel to a longitudinal direction, and FIG. 12d is a side view parallel to a lateral direction.

As illustrated in FIGS. 12A to 12D, compared to the semiconductor light-emitting device 2 of the above described second embodiment (see FIG. 9), a semiconductor light-emitting device 2c of the third modification differs in that a p-side electrode 12p and an n-side electrode 12n are exposed not only from a bottom surface of the semiconductor light-emitting device 2c but also from both side surfaces parallel to the longitudinal direction of the semiconductor light-emitting device 2c. That is, the p-side electrode 1.2p and the n-side electrode 12n penetrate an insulating layer 16 and a fluorescent material layer 14 in the lateral direction of the semiconductor light-emitting device 2c. In addition, the longitudinal direction of the semiconductor light-emitting device 2c is an aligning direction of the p-side electrode 12p and the n-side electrode 12n.

In accordance with the third modification, the semiconductor light-emitting device 2c can be mounted on a mount board by causing the side surface of the semiconductor light-emitting device 2c parallel to the longitudinal direction oppose a top surface of the mount board (not shown) and joining connecting members (not shown) such as solder bumps to a side surface of the p-side electrode 12p and a side surface of the n-side electrode 12n. Accordingly, other than a normal state in which a bottom surface of the semiconductor light-emitting device 2c opposes the top surface of the mount board, the semiconductor light-emitting device 2c can be mounted in a state of having fallen down sideways in which the side surface of the semiconductor light-emitting device 2c opposes the top surface of the mount board.

By mounting the semiconductor light-emitting device 2c in the state of having fallen down sideways, the top surface of the semiconductor light-emitting device 2c that is a primary light emitting surface can be disposed perpendicular relative to the top surface of the mount board. Such a light-emitting module can be used suitably as a side light of a liquid crystal panel, for example.

Further, in a case of mounting multiple semiconductor light-emitting devices 2c on one mount board, some of the semiconductor light-emitting devices 2c can be mounted in the normal state, and the rest of the semiconductor light-emitting devices 2c can be mounted in the state of having fallen down sideways so that light intensity distribution among the semiconductor light-emitting devices 2c can be cancelled, and a color breakup can be reduced.

Configurations as well as workings and effects of the third modification other than the above are similar to those of the above described second embodiment.

Figure 13A:
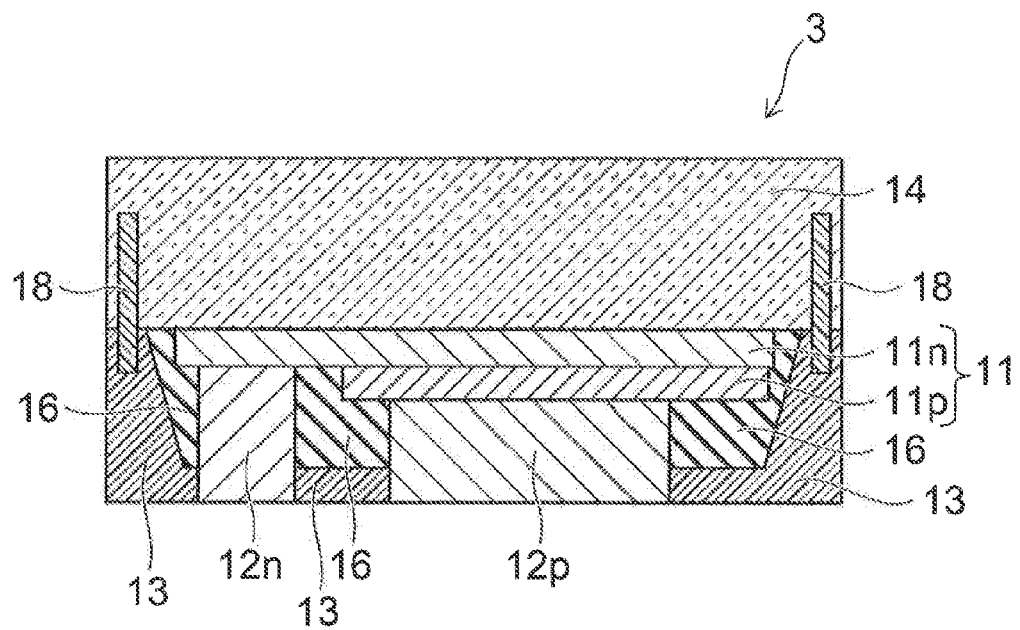
FIGS. 13A and 13B are diagrams exemplifying a semiconductor light-emitting device according to a third embodiment.

Next, a third embodiment will be described. FIG. 13A is a cross sectional view exemplifying a semiconductor light-emitting device of the third embodiment, and FIG. 13B is a top view of the semiconductor light-emitting device.

Figure 13B:
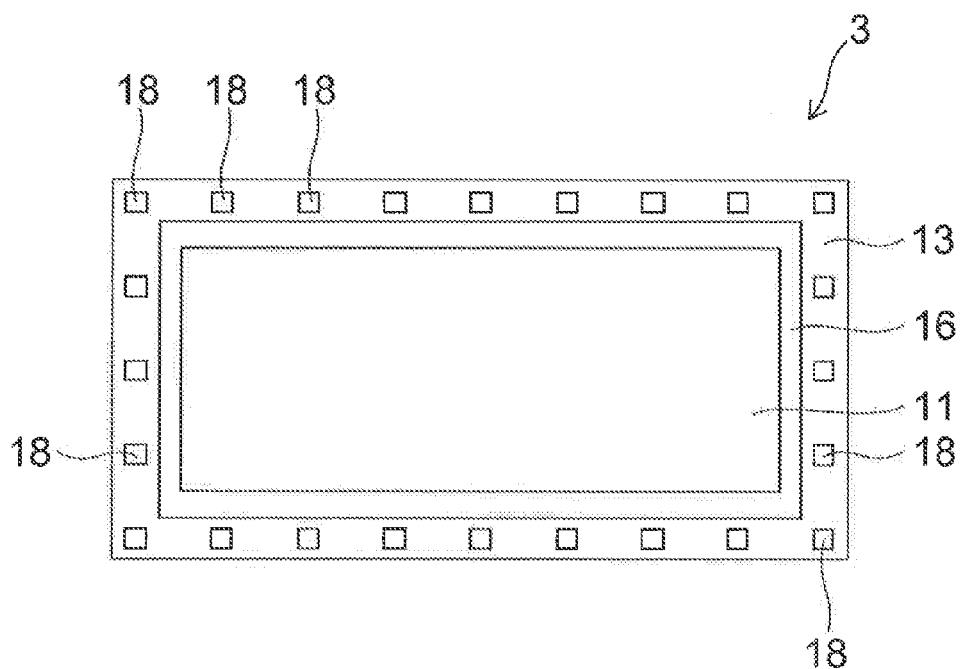

In addition, in FIG. 13B, a fluorescent material layer is omitted for the sake of easier view of the diagram.

As illustrated in FIGS. 13A and 13B, in the semiconductor light-emitting device 3 of the third embodiment, a semiconductor light-emitting layer 11, a p-side electrode 12p, an n-side electrode 12n, and an insulating layer 16 are provided. Configurations and positional relationships of these members are similar to those in the above described second embodiment (see FIG. 9). Further, a fluorescent material layer 14 is provided above the semiconductor light-emitting layer 11, and a reinforcement resin layer 13 is provided side and below the semiconductor light-emitting layer 11. The reinforcement resin layer 13 is formed of black resin, for example. The fluorescent material layer 14 and the reinforcement resin layer 13 are in contact with one another at a peripheral portion of the semiconductor light-emitting device 3. Therefore, a top surface and an upper portion of a side surface of the semiconductor light-emitting device 3 are configured of the fluorescent material layer 14, a lower portion of the side surface is configured of the reinforcement resin layer 13, and a bottom surface is configured of the reinforcement resin layer 13 as well as the p-side electrode 12p and the n-side electrode 12n.

Further, the semiconductor light-emitting device 3 is provided with multiple anchor members 18. A shape of each anchor member 18 is a bar shape extending in an up and down direction, and an upper portion of the anchor member 18 enters into the fluorescent material layer 14, and a lower portion of the anchor member 18 enters into the reinforcement resin layer 13. However, the anchor members 18 do not penetrate the fluorescent material layer 14 and the reinforcement resin layer 13, and are not exposed at an outer surface of the semiconductor light-emitting device 3. Further, the anchor members 18 do not pass through the insulating layer 16. The anchor members 18 are formed of resin material, for example, such as silicone resin that is adjusted to be harder than the fluorescent material layer 14 and the reinforcement resin layer 13. The multiple anchor members 18 are disposed in a loop shape along the side surface of the semiconductor light-emitting device 3.

Next, workings and effects of the third embodiment will be described. In the third embodiment, since the anchor members 18 are provided in the fluorescent material layer 14 and the reinforcement resin layer 13, adherence of the fluorescent material layer 14 and the reinforcement resin layer 13 is high due to their anchoring effect. Therefore, in a manufacturing process of the semiconductor light-emitting device 3, even if mechanical stress by dicing is applied for example, the fluorescent material layer 14 is more unlikely to exfoliate from the reinforcement resin layer 13. Accordingly, yield of the semiconductor light-emitting device 3 is high. Further, in the semiconductor light-emitting device 3 that has been manufactured, even if thermal stress is applied by repeating turn-on and turn-off of the semiconductor light-emitting layer 11, the fluorescent material layer 14 is more unlikely to exfoliate from the reinforcement resin layer 13. Therefore, reliability of the semiconductor light-emitting device 3 is high, and durability of the semiconductor light-emitting device 3 is superior.

Further, in the third embodiment, since a portion of light emitted from the semiconductor light-emitting layer 11 in a periphery of a horizontal direction passes through the anchor members 18 formed of the silicone resin not containing any fluorescent material, a color breakup can be reduced and light extraction efficiency can be increased due to a reason similar to the above described first embodiment.

Configurations as well as workings and effects of the third embodiment other than the above are similar to those of the above described first embodiment.

Figure 14A:
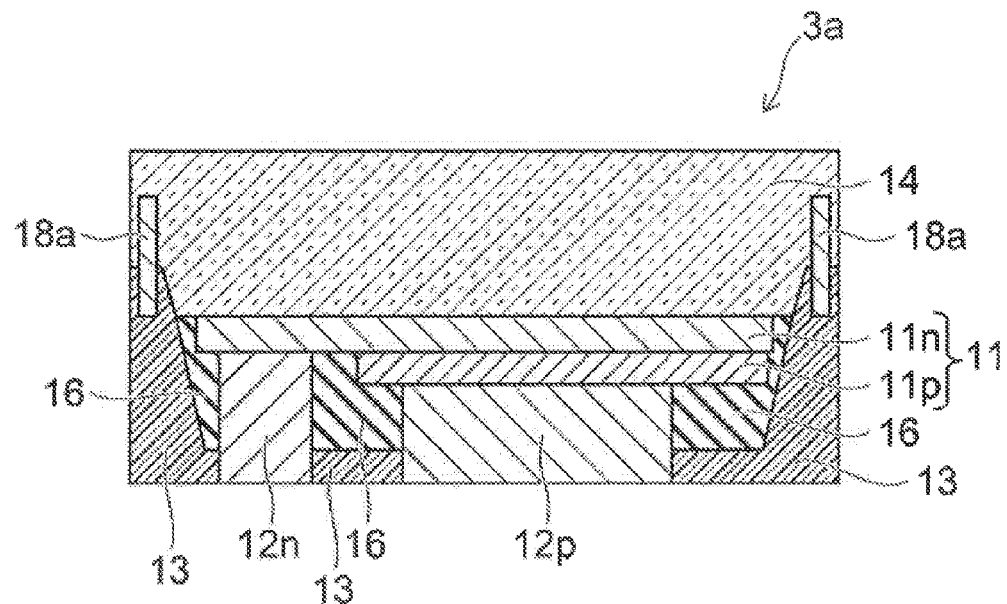
FIGS. 14A and 14B are diagrams exemplifying a semiconductor light-emitting device of a first modification according to the third embodiment.

Next, a first modification of the third embodiment will be described. FIG. 14A is a cross sectional view exemplifying a semiconductor light-emitting device of the first modification, and FIG. 14B is a top view of the semiconductor light-emitting device.

Figure 14B:
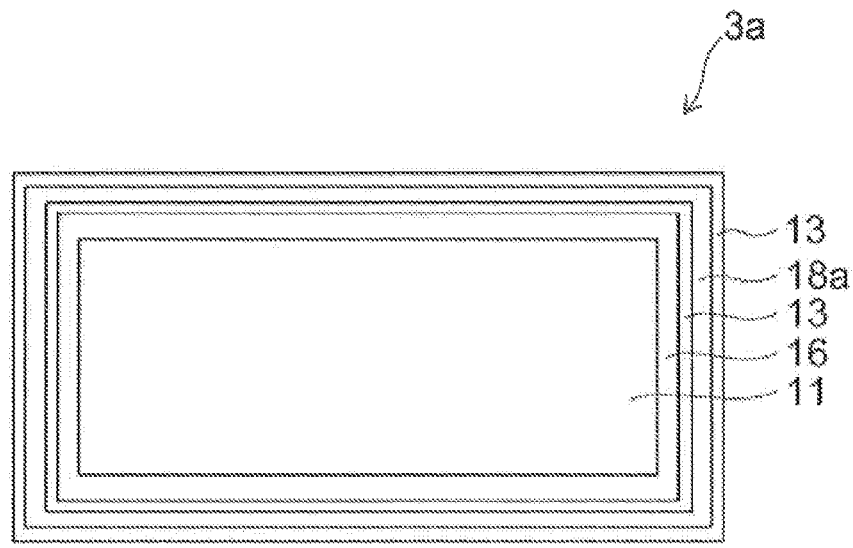

In addition, in FIG. 14B, a fluorescent material layer is omitted for the sake of easier view of the diagram.

As illustrated in FIGS. 14A and 14B, compared to the semiconductor light-emitting device 3 of the above described third embodiment (see FIGS. 13A and 13B), a semiconductor light-emitting device 3a of the first modification differs in that a reinforcement resin layer 13 protrudes above a top surface of a semiconductor light-emitting layer 11 at a peripheral portion of the semiconductor light-emitting device 3a, a position of an anchor member 18a is accordingly displaced upward, a bottom surface of the anchor member 18a is at a same height as the top surface of the semiconductor light-emitting layer 11, a shape of the anchor member 18a is not a bar shape but a frame shape, and the anchor member 18a is made of silicon (Si).

Such a semiconductor light-emitting device 3a can be manufactured by the following method, for example. That is, firstly, a silicon substrate (not shown) is prepared as a substrate for growing crystal, and the semiconductor light-emitting layer 11 is epitaxially grown on a top surface of the silicon substrate. Next, the p-side electrode 12p, the n-side electrode 12n, and the insulating layer 16 are formed. Then, a groove is formed in a region in the top surface of the silicon substrate that is not covered with the insulating layer 16. Next, the reinforcement resin layer 13 is formed by applying the black resin so as to fill in the groove and cover the p-side electrode 12p, the n-side electrode 12n, and the insulating layer 16. At the occasion, a portion of the silicon substrate is caused to be disposed within the reinforcement resin layer 13.

Next, the silicon substrate is selectively removed. At the occasion, a portion of the silicon substrate that is in contact with the semiconductor light-emitting layer 11 is removed., and the portion of the silicon substrate that is positioned immediately below the portion positioned within the reinforcement resin layer 13 is made to remain. Therefore, the semiconductor light-emitting layer 11 is exposed, and the anchor member 18a made of silicon is formed. Then, the fluorescent material layer 14 is formed so as to bury an exposed portion of the anchor member 18a. The semiconductor light-emitting device 3a is manufactured accordingly.

In accordance with the modification, the anchor member 18a made of hard silicon can be formed by making a portion of the silicon substrate that had been used as the substrate for growing crystal remain. Further, since the anchor member 18a is disposed in the frame shape in the peripheral portion of the semiconductor light-emitting device 3a, an effect of suppressing color breakup is high.

Configurations as well as workings and effects of the first modification other than the above are similar to those of the above described third embodiment.

Next, a second modification of the third embodiment will be described. FIG., 15 is a cross sectional view exemplifying a semiconductor light-emitting device of the second modification.

Figure 15:
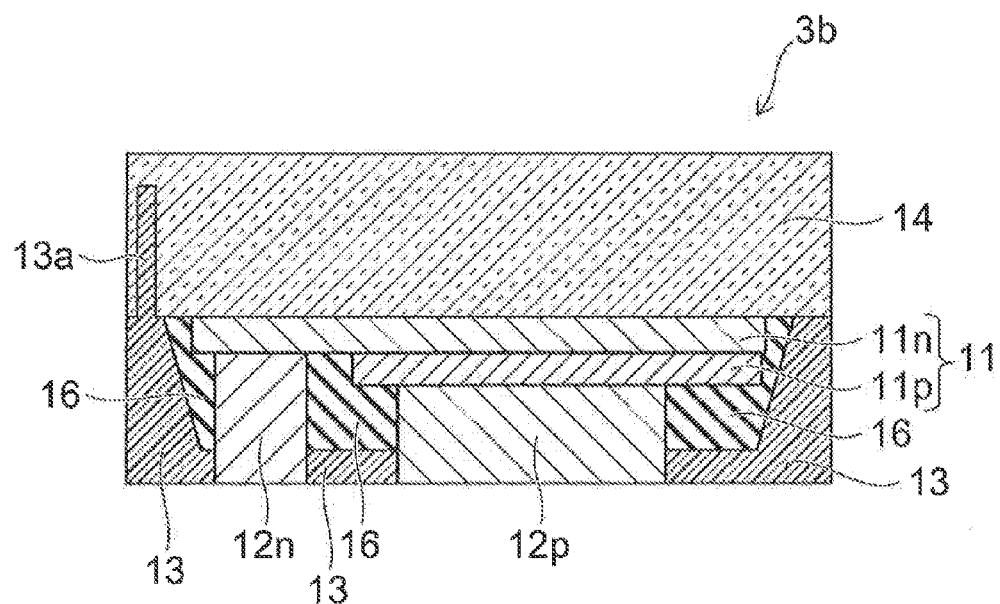
FIG. 15 is a cross sectional view exemplifying a semiconductor light-emitting device of a second modification according to the third embodiment.

As illustrated in FIG. 15, a semiconductor light-emitting device 3b of the second modification does not have anchor members 18 (see FIGS. 13A and 13B) provided therein, and instead, anchor sections 13a that intrude into a fluorescent material layer 14 are formed at a top surface of a reinforcement resin layer 13. The anchor sections 13a are formed of a same material as a main body portion of the reinforcement resin layer 13 such as black resin, for example, protrude in a bar-shape, and are formed integrally with the main body portion of the reinforcement resin layer 13.

The anchor sections 13a are formed of the black resin, and since their visibility is high, the anchor sections 13a can be used as cathode marks when they are disposed only on an n-side electrode 12n side.

Configurations as well as workings and effects of the second modification other than the above are similar to those of the above described third embodiment.

Next, a third modification of the third embodiment will be described. FIG. 16A is a top view exemplifying a semiconductor light-emitting device of the third modification, FIG. 16B is a bottom view of the semiconductor light-emitting device, FIG. 16C is a side view parallel to a longitudinal direction, and FIG. 16d is a side view parallel to a lateral direction.

In addition, in FIG. 16A, a fluorescent material layer is omitted for the sake of easier view of the diagram.

As illustrated in FIGS. 16A to 16D, compared to the semiconductor light-emitting device 3b of the second modification of the above described third embodiment (see FIG. 15), a semiconductor light-emitting device 3c of the third modification differs in that a chromaticity adjusting layer 15 is provided between a reinforcement resin layer 13S and a fluorescent material layer 14. The chromaticity adjusting layer 15 is disposed in a frame shape in a peripheral portion of the semiconductor light-emitting device 3c, and anchor sections 13a penetrate the chromaticity adjusting layer 15 in an up and down direction. As described in the above described first embodiment, the chromaticity adjusting layer 15 is formed of transparent resin that does not contain a fluorescent material. In addition, the chromaticity adjusting layer 15 may contain the fluorescent material at a lower concentration than in the fluorescent material layer 14.

In accordance with the modification, since the chromaticity adjusting layer 15 is provided in the peripheral portion of the semiconductor light-emitting device 3c, a color breakup can be suppressed by a same reason as the above described first embodiment. Further, since the anchor section 13a formed in the reinforcement resin layer 13 penetrates the chromaticity adjusting layer 15 and intrudes into the fluorescent material layer 14, adherence between the reinforcement resin layer 13, the chromaticity adjusting layer 15, and the fluorescent material layer 14 can be increased.

Configurations as well as workings and effects of the third modification other than the above are similar to those of the second modification of the above described third embodiment.

In addition, the modification may be combined with the above described third embodiment or the first modification of the third embodiment. That is, the chromaticity adjusting layer 15 may be provided in a semiconductor light-emitting device provided with the anchor members 18 or the anchor member 18a. In the case, when the anchor members 18 or the anchor member 18a are made to penetrate the chromaticity adjusting layer 15, the adherence between the reinforcement resin layer 13, the fluorescent material layer 14, and the chromaticity adjusting layer 15, can be increased.

Next, a fourth embodiment will be described.

Figure 17A:
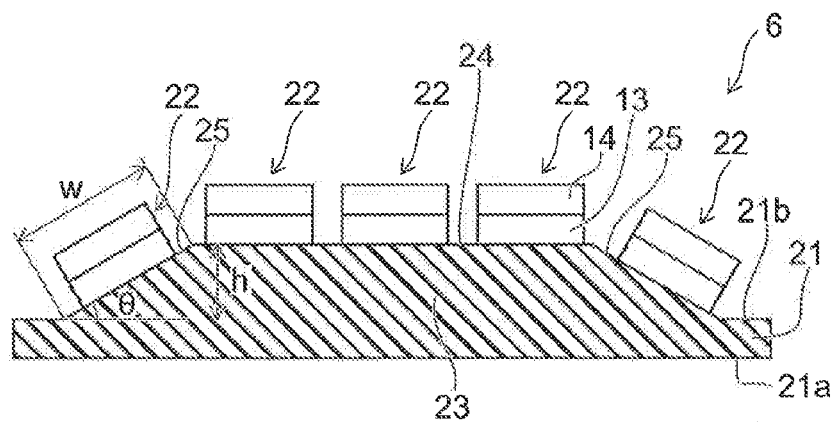
FIGS. 17A and 17B are diagrams exemplifying an light-emitting module according to a fourth embodiment.
Figure 17B:
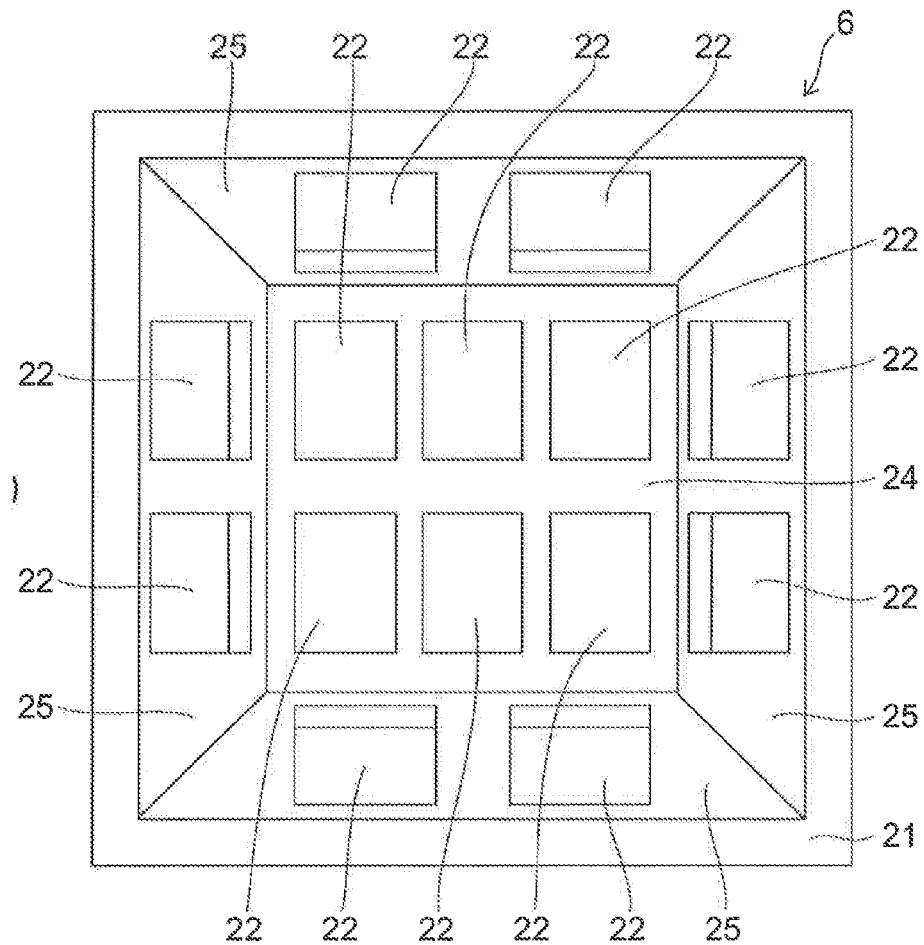

FIG. 17A is a cross sectional view exemplifying a light-emitting module of the fourth embodiment, and FIG. 17B is a top view of the light-emitting module.

FIG. 18A is a top view exemplifying a semiconductor light-emitting device of the light-emitting module of the fourth embodiment, FIG. 18B is a bottom view of the light-emitting module, FIG. 18C is a cross sectional view parallel to a longitudinal direction, and FIG. 18D is a side view parallel to a lateral direction.

As illustrated in FIGS. 17A and 17B1, in a light-emitting module 6 of the fourth embodiment, one mount board 21 and multiple semiconductor light-emitting devices 22 mounted on the mount board 21 are provided.

An entirety of a bottom surface 21a of the mount board 21 is flat. A trapezoid-based pyramid-shaped convex portion 23 is provided on a top surface 21b of the mount board 21. A top base surface of the convex portion 23 is a region (a first region) 24 that is flat and parallel to the bottom surface 21a, and four slope surfaces of the convex portion 23 are flat regions (second regions) 25 sloped to the region 24. Accordingly, the region 24 is provided at one place, the regions 25 are provided at four places, and the regions 25 are sloped to one another. Further, the semiconductor light-emitting devices 22 are mounted on the region 24 and the respective regions 25.

As illustrated in FIGS. 18A to 18D, the configuration of the semiconductor light-emitting device 22 is for example similar to the semiconductor light-emitting device 101 of the above described comparative example (see FIG. 3). That is, a semiconductor light-emitting layer 1.1 is provided in the semiconductor light-emitting device 22, and columnar-shaped p-side electrode 12p and n-side electrode 12n are provided below the semiconductor light-emitting layer 11. Further, a reinforcement resin layer 13 made of black resin for example and covering a side surface and a bottom surface of the semiconductor light-emitting layer 11 as well as side surfaces of the p-side electrode 12p and n-side electrode 12n is provided side and blow the semiconductor light-emitting layer 11. Further, a fluorescent material layer 14 in which a fluorescent material (not shown) is dispersed in transparent resin is provided above the semiconductor light-emitting layer 11. Moreover, the top surface of the semiconductor light-emitting device 22 becomes a primary light extracting surface 22a.

Dimensions of the respective regions of the mount board 21 can be selected in accordance with a size and a mounting number of the semiconductor light-emitting devices 22. However, a width w of the regions 25 is set wider than a length of a short edge of the semiconductor light-emitting devices 22. For example, in a case where a length of a long edge of the semiconductor light-emitting devices 22 is 0.64 mm, a length of a short edge is 0.34 mm, and a height is 0.18 mm, the width w of the regions 25 can be at or more than a dimension in which a margin for an actual positioning is added to the length 0.34 mm of the short edge of the semiconductor light-emitting devices 22, and for example may be 0.5 mm. Further, an inclined angle θ of the regions 25 relative to the region 24 can be decided by taking convenience of mounting and an effect of reducing a color breakup into consideration. Although difficulty of mounting increases with a larger inclined angle θ, the effect of reducing the color breakup becomes more prominent. Further, a height h of the convex portion 23 is decided by the width w of the regions 25 and the inclined angle θ. For example, the inclined angle θ may be 30° or 45°. The height h is 0.25 mm and 0.35 mm in respective cases.

Next, workings and effects of the fourth embodiment will be described.

As described in the first embodiment, the color breakup occurs in each semiconductor light-emitting device 22. However, in the fourth embodiment, flat regions 24 and regions 25 that are sloped to one another are formed on the top surface 21b of the mount board 21, and the semiconductor light-emitting devices 22 are mounted on respective regions. Therefore, the primary light extracting surface 22a of the semiconductor light-emitting device 22 mounted on each region is sloped to one another. As a result, the color breakup of each semiconductor light-emitting device 22 is cancelled, and the color breakup in the light-emitting module 6 as a whole can be reduced. Further, the light-emitting module 6 as a whole can obtain broader light intensity distribution property than the light intensity distribution property of each semiconductor light-emitting device 22.

Further, in the fourth embodiment, the semiconductor light-emitting devices 22 can be made compact by configuring the semiconductor light-emitting devices 22 as described above. Therefore, the width w of the regions 25 becomes narrower, and since the height h of the convex portion 23 becomes lower accordingly, solder-paste printing onto the mount board 21 and mounting of the semiconductor light-emitting devices 22 do not become so difficult despite providing the sloped regions 25 on the top surface 21b of the mount board 21. Therefore, the light-emitting module 6 can be manufactured easily.

In addition, in the fourth embodiment, although the shape of the convex portion 23 was exemplified as the trapezoid-based pyramid shape, no limitation is made hereto so long as two or more flat surfaces that are sloped to one another are formed. For example, the shape of the convex portion 23 can be formed into a pyramid shape other than the trapezoid-based pyramid shape, such as an octagon-based pyramid shape. In the case, eight regions 25 sloped to one another are formed as the sloped surfaces of the convex portion 23. Further, a concave portion may be formed instead of the convex portion 23.

Further, the semiconductor light-emitting devices 22 in the fourth embodiment are not limited to the configurations illustrated in FIGS. 18A to 18D. For example, the semiconductor light-emitting device of one of the above described first to third embodiments and the modifications of the first to third embodiments may be mounted on the mount board 21.

Moreover, in the above described respective embodiments and modifications of the embodiments, although examples in which the semiconductor illuminating layer 11 emits the blue light and the fluorescent material absorbs the blue light and radiates the yellow light were shown, no limitations are made hereto. The semiconductor illuminating layer 11 needs only to emit visible light with a certain wavelength, and the fluorescent material needs only to radiate visible light having a different wavelength from the certain wavelength. For example, the semiconductor light-emitting layer 11 may emit the blue light, and the fluorescent material layer 14 may contain a fluorescent material that absorbs the blue light and radiates green light and a fluorescent material that absorbs the blue light and radiates red light. Therefore also, the semiconductor light-emitting device as a whole can emit white light.

In accordance with the above described embodiments, a semiconductor light-emitting device and a light-emitting module with small directional dependency on chromaticity can be implemented.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor light-emitting device, comprising:
   a semiconductor light-emitting layer to emit first light;
   a pair of electrodes connected to the semiconductor light-emitting layer;
   a fluorescent material layer in contact with at least a center portion of the semiconductor light-emitting layer, and containing a fluorescent material to absorb the first light and radiate second light; and
   a first layer covering at least a peripheral portion of the semiconductor light-emitting layer, one edge of the first layer extending toward a plane of the fluorescent material layer opposite to an interface of the semiconductor light-emitting layer and the fluorescent material layer, wherein
   the fluorescent material is not contained in the first layer.

2. The semiconductor light-emitting device according to claim 1, wherein
   the fluorescent material layer and the first layer each includes resin, and
   a refractive index of the resin of the first layer is higher than a refractive index of the resin of the fluorescent material layer.

3. The semiconductor light-emitting device according to claim 2, wherein
   each of the electrodes has a first surface connected to the semiconductor light-emitting layer and a second surface opposed to the first surface, the second surface being exposed on a surface of the device.

4. The semiconductor light-emitting device according to claim 1, wherein
   each of the electrodes has a first surface connected to the semiconductor light-emitting layer and a second surface opposed to the first surface, the second surface being exposed on a surface of the device.

* * * * *